(12) United States Patent
Chen et al.

(10) Patent No.: US 12,200,886 B2
(45) Date of Patent: Jan. 14, 2025

(54) SYSTEM AND METHOD FOR THERMAL MANAGEMENT OF REMOVABLE COMPONENTS

(71) Applicant: Dell Products L.P., Round Rock, TX (US)

(72) Inventors: Julian Yu-Hao Chen, Austin, TX (US); Shun-Cheng Hsu, Zhubei (TW); Hung-Jen Chen, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 352 days.

(21) Appl. No.: 18/048,136

(22) Filed: Oct. 20, 2022

(65) Prior Publication Data
US 2024/0138082 A1 Apr. 25, 2024
US 2024/0237246 A9 Jul. 11, 2024

(51) Int. Cl.
*H05K 5/00* (2006.01)
*H05K 5/02* (2006.01)
*H05K 7/14* (2006.01)
*H05K 7/20* (2006.01)

(52) U.S. Cl.
CPC ......... *H05K 5/0286* (2013.01); *H05K 5/0221* (2013.01); *H05K 7/1424* (2013.01); *H05K 7/20* (2013.01)

(58) Field of Classification Search
CPC ....... H05K 5/0286; H05K 7/1424; H05K 7/20
USPC ......................................................... 361/709
See application file for complete search history.

(56) References Cited

U.S. PATENT DOCUMENTS

| | | | |
|---|---|---|---|
| 5,602,721 A | 2/1997 | Slade et al. | |
| 5,761,033 A | 6/1998 | Wilhelm | |
| 5,831,821 A * | 11/1998 | Scholder | H05K 7/1429 361/679.58 |
| 5,963,431 A * | 10/1999 | Stancil | G06F 1/186 361/796 |
| 7,698,095 B2 | 4/2010 | Chung et al. | |
| 7,701,713 B2 | 4/2010 | Li | |
| 8,182,319 B2 | 5/2012 | Ong et al. | |
| 8,550,702 B2 | 10/2013 | Campbell et al. | |
| 9,129,958 B2 | 9/2015 | Mallik et al. | |
| 9,237,671 B2 | 1/2016 | Chen et al. | |
| 9,820,411 B2 | 11/2017 | Alshinnawi et al. | |
| 10,123,452 B2 | 11/2018 | Chen et al. | |
| 10,177,107 B2 | 1/2019 | Camarota | |
| 10,274,945 B2 | 4/2019 | Arensmeier et al. | |
| 10,709,032 B1 | 7/2020 | Holyoake et al. | |
| 11,019,748 B2 | 5/2021 | Avvaru et al. | |
| 11,064,808 B2 | 7/2021 | Chen et al. | |
| 11,129,293 B2 | 9/2021 | Wurmfeld | |
| 11,262,809 B2 | 3/2022 | Pham et al. | |

(Continued)

*Primary Examiner* — Zhengfu J Feng
(74) *Attorney, Agent, or Firm* — Womble Bond Dickinson (US) LLP (57) ABSTRACT

Methods, systems, and devices for providing computer implemented services are disclosed. To provide the computer implemented services, the quantity of hardware resources available for providing the computer implemented services may be modified. The quantity of hardware resources may be modified by adding removable cards to a host system. The host system may, while the added removable cards are cold, selectively warm the removable cards through conduction heating to retain their temperatures within operating temperature ranges.

20 Claims, 6 Drawing Sheets

(56) References Cited

U.S. PATENT DOCUMENTS

| | | |
|---|---|---|
| 11,293,659 B2 | 4/2022 | Brahme et al. |
| 11,320,164 B2 | 5/2022 | Roth |
| 2001/0040203 A1 | 11/2001 | Brock et al. |
| 2005/0152122 A1* | 7/2005 | Fan ................... H05K 7/1409 361/752 |
| 2009/0067126 A1* | 3/2009 | Kunz .................. H05K 7/1429 361/679.32 |
| 2010/0254096 A1* | 10/2010 | Kim ..................... G06F 1/185 361/737 |
| 2011/0100668 A1 | 5/2011 | Syed |
| 2011/0228473 A1 | 9/2011 | Anderson et al. |
| 2012/0229971 A1 | 9/2012 | Mills et al. |
| 2014/0334084 A1 | 11/2014 | Fricker |
| 2015/0177750 A1 | 6/2015 | Bailey et al. |
| 2015/0180234 A1 | 6/2015 | Bailey et al. |
| 2015/0289405 A1 | 10/2015 | Stewart et al. |
| 2015/0359146 A1 | 12/2015 | Bailey et al. |
| 2016/0044819 A1 | 2/2016 | Bailey et al. |
| 2017/0177007 A1 | 6/2017 | Shelnutt et al. |
| 2017/0181329 A1 | 6/2017 | Shelnutt et al. |
| 2018/0011522 A1 | 1/2018 | Shirakami et al. |
| 2022/0104380 A1 | 3/2022 | Hattangadi et al. |
| 2022/0200250 A1 | 6/2022 | Brooks et al. |

\* cited by examiner

SYSTEM AND METHOD FOR THERMAL MANAGEMENT OF REMOVABLE COMPONENTS

FIELD OF THE EMBODIMENTS

Embodiments disclosed herein relate generally to device management. More particularly, embodiments disclosed herein relate to systems and methods for retaining temperatures of components within operating temperature ranges.

BACKGROUND

Computing devices may store data and used stored data. For example, computing devices may utilize data when providing computer implemented services. If computing devices are unable to access data, process data, and/or perform other functions, then the computing devices may be unable to provide some, or all, of the computer implemented services desired by users of the computing devices.

BRIEF DESCRIPTION OF THE DRAWINGS

Embodiments are illustrated by way of example and not limitation in the figures of the accompanying drawings in which like references indicate similar elements.

DETAILED DESCRIPTION

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References in the specification to "adapted to" may, in the context of a programmable device, indicate that the programmable device has been programmed to perform the functionality described with respect to the programmable devices. In the context of a static device, "adapted to" may indicate that the device include circuitry to perform the functionality described with respect to the static devices. In the context of mechanical device, "adapted to" may mean that the mechanical device is designed to perform a particular function and may include a shape, size, structure, components thereof, etc. to accomplish the function.

In general, embodiments disclosed herein relate to methods, systems, and devices for providing computer implemented services. The computer implemented services may include any quantity and type of such services.

To provide the computer implemented services, one or more of the data processing systems may be utilized. The type and quantity of service provided by the data processing systems may be limited based on the hardware resources available to the data processing systems.

To provide flexibility with respect to the available hardware resources, the data processing systems may include removable card holders usable to add hardware resources to the data processing systems. To do so, removable cards may be inserted into the removable card holders which may operably connect the hardware resources of the removable cards to other hardware resources of the data processing system, thereby allowing for increase hardware resource availability.

The removable cards may include hardware components that having thermal operating ranges. To retain the temperatures of the hardware components in the thermal operating ranges, the removable card holder may include functionality to warm the hardware components via a conduction heating path. By doing so, the hardware components may be more likely to be able to operate in environment where ambient temperatures may otherwise preclude their operation.

By doing so, embodiments disclosed herein may provide a data processing system capable of operating under a wider array of environment conditions by mitigating (e.g., reducing, limiting, etc.) the impact of environmental conditions in which the data processing system resides. Thus, embodiments disclosed herein may address the technical problem of operating condition limitations of data processing systems and removable card therein. The disclosed embodiments may address this problem by providing a data processing system with active heating capabilities (e.g., usable to warm hardware components that may otherwise be inoperable thereby robbing the data processing systems of some of their capabilities) to mitigate the impact of ambient temperatures on the hardware components of removable cards hosted by data processing systems.

In an embodiment, a data processing system is provided. The data processing system may include a processor; and a removable card holder comprising: a housing delineating a volume in which a removable card is positioned while the removable card is in the removable card holder; complementary electrical contacts operably connected to the processor, the complementary electrical contacts being adapted to contact electrical contacts of the removable card while the removable card is positioned in the removable card holder to form an operable connection between the processor and the removable card; an access door positioned on a surface of the housing that prevents access to a portion of the removable card while the removable card is in the removable card holder, the access door adapted to: translate between two positions, in a first position of the two positions the access door closes the surface of the housing and in a second position of the two positions the access door opens a hole in the surface that allows access to the portion of the removable card while the removable card is in the removable card holder; and a heating assembly positioned on the access door to contact the portion of the removable card while the access door is in the first position and the removable card is in the removable card holder and disengage the contact without translating along a surface of the portion of the removable card while the access door moves from the first position to the second position.

The heating assembly may include a heating element adapted to selectively generate heat to warm the removable card while the access door is in the first position and the removable card is in the removable card holder.

The heating assembly may also include a thermal pad adapted to conform to a shape of the portion of the removable card while the access door moves from the second position to the first position and the removable card is in the removable card holder.

The thermal pad may also be adapted to conduct heat between the heating element and the portion of the removable card while the access door is in the second position.

The access door may include a rotary joint adapted to guide the access door between the two positions along a curved path.

The access door may include a sliding joint adapted to guide the access door between the two positions along a straight path.

The housing may include a latch positioned with an edge of the access door, and the latch being adapted to reversibly hold the access door in the first position.

The removable card holder may include a Peripheral Component Interconnect Express (PCIe) riser cage.

In an embodiment, a data processing system further comprising the removable card is provided.

In an embodiment, the removable card comprises a hardware component that is a temperature sensitive hardware component with a thermal operating range.

Figure 1A:
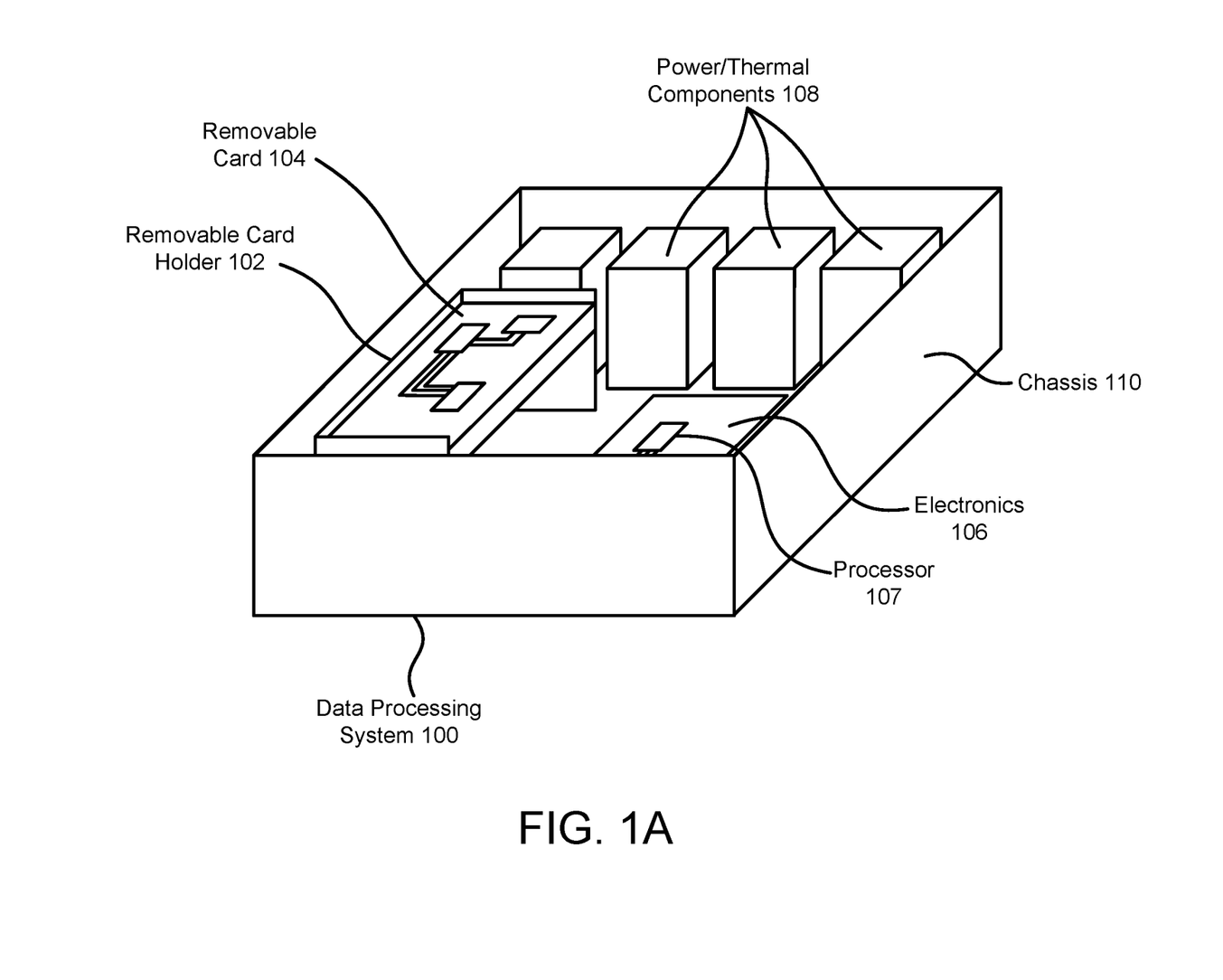
FIG. 1A shows a diagram illustrating a system in accordance with an embodiment.

Turning to FIG. 1A, a diagram illustrating a system in accordance with an embodiment is shown. The system may provide computer implemented services. To provide the computer implemented services, the system may include data processing system 100.

Data processing system 100 may include functionality to provide various types of computer implemented services. The computer implemented services may include any number and type of computer implemented services. The computer implemented services may include, for example, database services, data processing services, electronic communication services, and/or any other services that may be provided using one or more computing devices. Other types of computer implemented services may be provided by data processing system 100 without departing from embodiments disclosed herein.

To provide the computer implemented services, data processing system 100 may include various components such as electronics 106 and power/thermal components 108. Electronics 106 may include various types of hardware components such as processors (e.g., 107), memory modules, storage devices, communications devices, and/or other types of devices. Any of these hardware components may be operably connected to one another using circuit card traces, cabling, connectors, etc.

Power/thermal components 108 may power to any of the components of data processing systems 100 and/or thermally mange any of the components of data processing systems 100. For example, power/thermal components 108 may include power supplies, fans, and/or other types of devices usable to power and/or thermally manage the components.

To provide different types of computer implemented services, various types of computing resources (e.g., provided by hardware devices) may be utilized. Consequently, the computing resources of a data processing system may vary depending on how the system is used. For example, to provide database services, data processing system 100 may utilize large amounts of storage resources (which may be provided by storage devices such as solid state drives or other types of storage devices). In contrast, to provide instant messaging services, data processing system 100 may utilize large amounts of communication resources (which may be provided by communications devices such as network interface cards).

To facilitate flexibility in the available computing resources, data processing system 100 may include removable card holder 102. Removable card holder 102 may facilitate interconnection of various removable cards (e.g., 104) to electronics 106. While interconnected via removable card holder 102, a removable card (e.g., 104) may contribute its computing resources for the performance of various tasks managed by electronics 106. Consequently, the computing resources of a data processing system may be modified by adding and/or removing removable cards to or from removable card holder 102.

For example, removable card 104 may be operably connected to processor 107 via removable card holder 102. Processor 107 may task removable card 104 with performing various functions that may be used by processor 107 in providing various computer implemented services. However, at other points in time processor 107 may be tasked with providing other services that do not need the resources provided by removable card 104. In such a scenario, removable card 104 may be removed and other removable cards may be inserted into removable card holder 102 thereby providing processor 107 with access to other types of computing resources.

In an embodiment, removable card holder 102 is implemented as a peripheral component interconnect express (PCIe) device cage (e.g., a riser cage) or other type of structure for holding various devices that host various hardware components that may contribute computing resources to a data processing system. A device cage may be physical structure that bounds a volume in which removable cards may be positioned. In FIG. 1A, removable card holder 102 is illustrated with an open top side (e.g., to facilitate visibility of removable card 104). However, a removable card holder may include any number of walls that bound a space in which any number of removable cards may be positioned. Consequently, removable card holder 102 may surround and/or otherwise prevent access (e.g., physical, airflow, etc.) to various portions of removable card 104. When so positioned, removable card holder 102 may operably connect the removable cards to electronics 106 and/or other components.

For example, removable card holder 102 may include one or more electrical connectors (which may include any number of electrical contacts such as circuit card pads) which may provide electrical connections to removable cards (e.g., using complementary electrical connectors on the removable cards) positioned in removable card holder 102. The electrical connectors of removable card holder 102 may be operably connected to electronics 106 (e.g., via traces, cabling, etc.) thereby facilitating operable connection between removable cards positioned in removable card holder 102 and various other components of data processing system 100.

Removable cards may be implemented with physical devices that include any number of hardware components. When positioned in removable card holder 102, one or more of the hardware components of the removable card may be operably connected to electronics 106 (or a portion thereof) and/or other devices. The removable cards may include complementary electrical connectors (e.g., circuit card pads if an edge connector is implemented) that allow for formation of operable connections between the removable cards and the removable card holder.

However, the operation (e.g., successful operation) of the hardware components may be predicated on certain conditions of the hardware components being met. These conditions may include, for example, (i) thermal conditions (e.g., retaining temperatures of the hardware components within corresponding thermal operating ranges), (ii) power conditions (e.g., have access to certain levels of electrical power), and/or (iii) other types of conditions.

For example, consider a scenario in which data processing system 100 is located in an environment in which the ambient temperature is outside (e.g., lower) the thermal operating range of a hardware component of removable card 104. The cool ambient temperature may decrease a temperature of the hardware component outside of its thermal operating range. Doing so may impair the operation of the hardware component (e.g., prevent its operation, cause errors in its operation, subject the hardware component to damage if operated, etc.). Refer to FIG. 1D for additional details regarding the potential for cooling of removable card 104.

In general, embodiments disclosed herein relate to systems, methods, and devices for improving the likelihood data processing systems providing computer implemented services using hardware components of removable cards. To do so, embodiments disclosed herein may facilitate warming of hardware components of removable cards that may be added to and/or replaced over time. Rather than requiring that all of the removable cards include heat generation functionality for hardware component warming, embodiments may provide a removable card holder that include functionality to warm portions of removable cards positioned therein.

For example, consider a scenario where a removable card includes a hardware components that generates heat during operation but requires that its temperature stay within a thermal operating range. To prevent overheating, a heatsink or other thermal dissipation structure may be positioned with the hardware component. To facilitate warming of the hardware component, removable card holder 102 may include a resistive heating element that may be reversibly placed into thermal communication with the heatsink of the hardware component via a thermal condition path. When the temperature of the hardware component is below or may become below its thermal operating range, the heating element may generate heat which may be transmitted to the hardware component via the thermal condition path (e.g., via the heatsink) thereby facilitating efficient warming of the hardware component (e.g., in contrast to other types of heating such as by convection, radiation, etc.

Any of the components of data processing system 100 may be positioned in chassis 110. Chassis 110 may include a physical structure for housing the components of data processing system 100. While illustrated in FIG. 1A as having a rack mountable form factor, it will be appreciated that chassis 110 may have other form factors and the components illustrated in FIG. 1A may be arranged different from that illustrated in FIG. 1A without departing from embodiments disclosed herein.

Figure 1B:
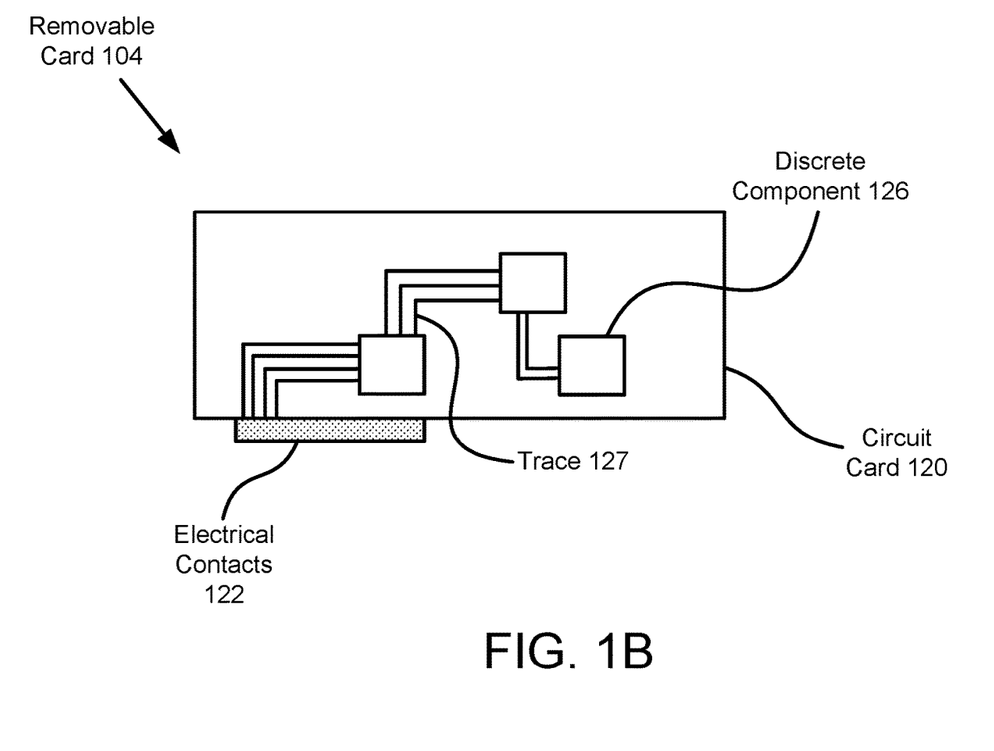
FIG. 1B shows a top view diagram illustrating a removable card in accordance with an embodiment.
Figure 1C:
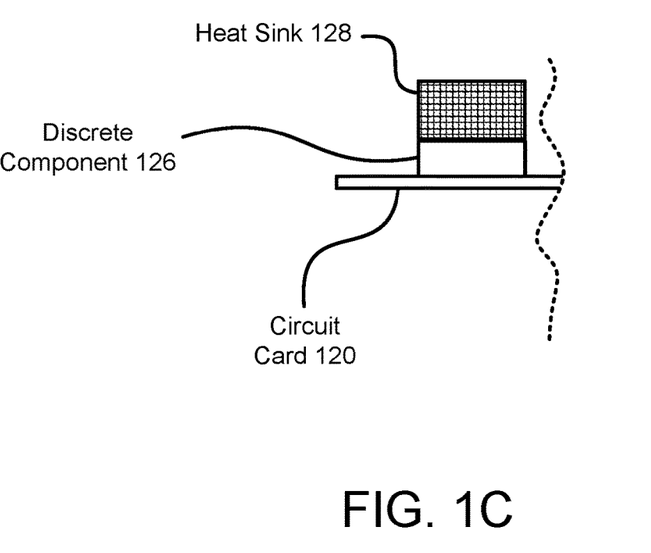
FIG. 1C shows a side view diagram illustrating a removable card in accordance with an embodiment.
Figure 1D:
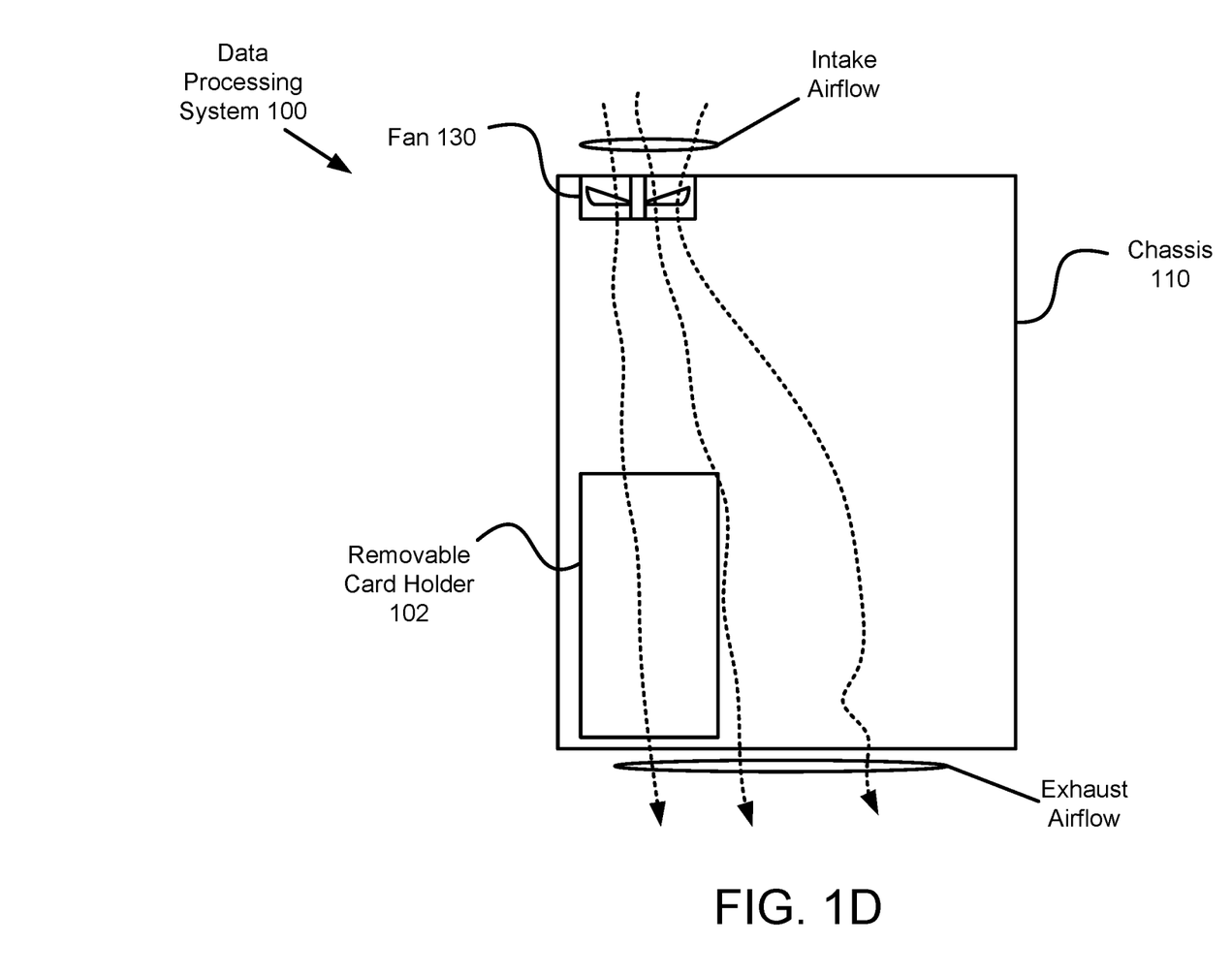
FIG. 1D shows a top view diagram illustrating gas flow in a data processing system in accordance with an embodiment.
Figure 1E:
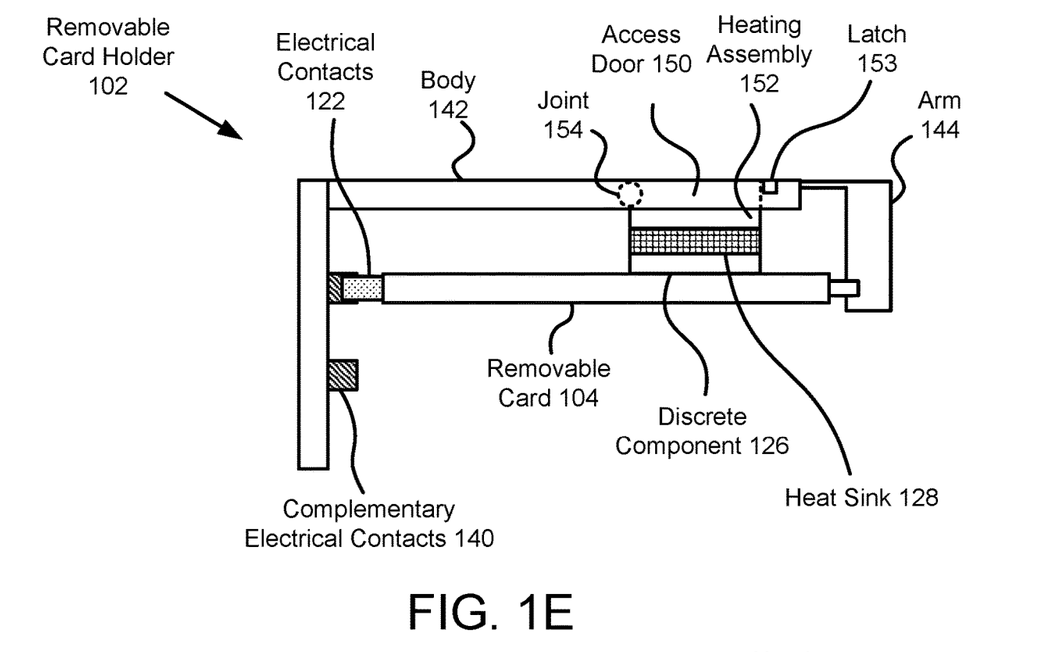
FIGS. 1E-1F show side view diagrams illustrating a removable card holder in accordance with an embodiment.
Figure 1F:
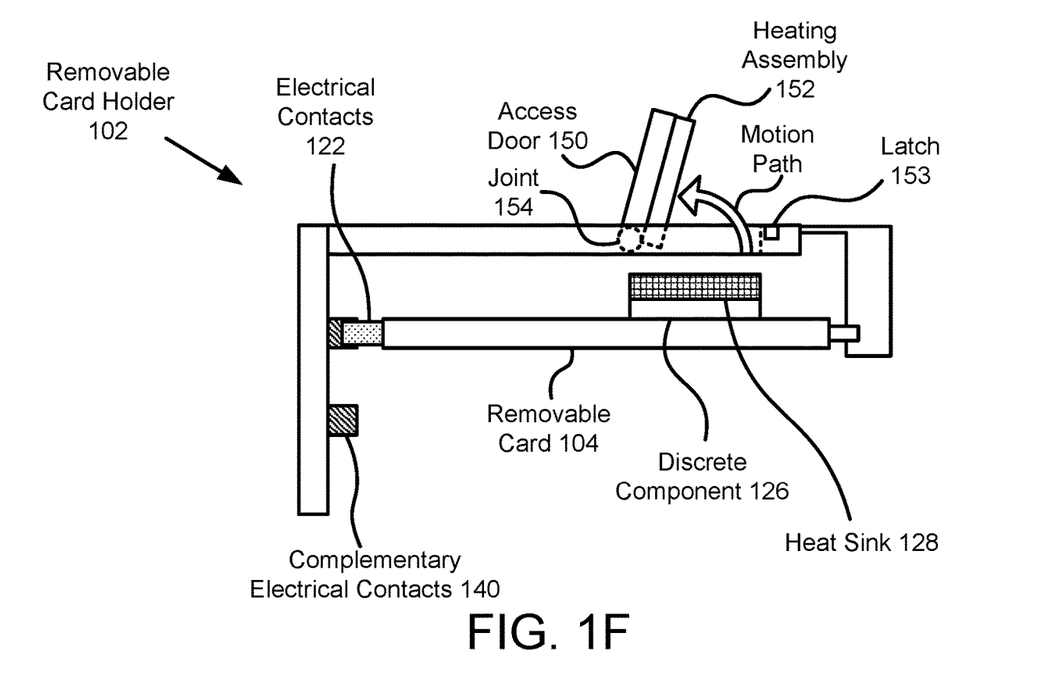
Figure 1G:
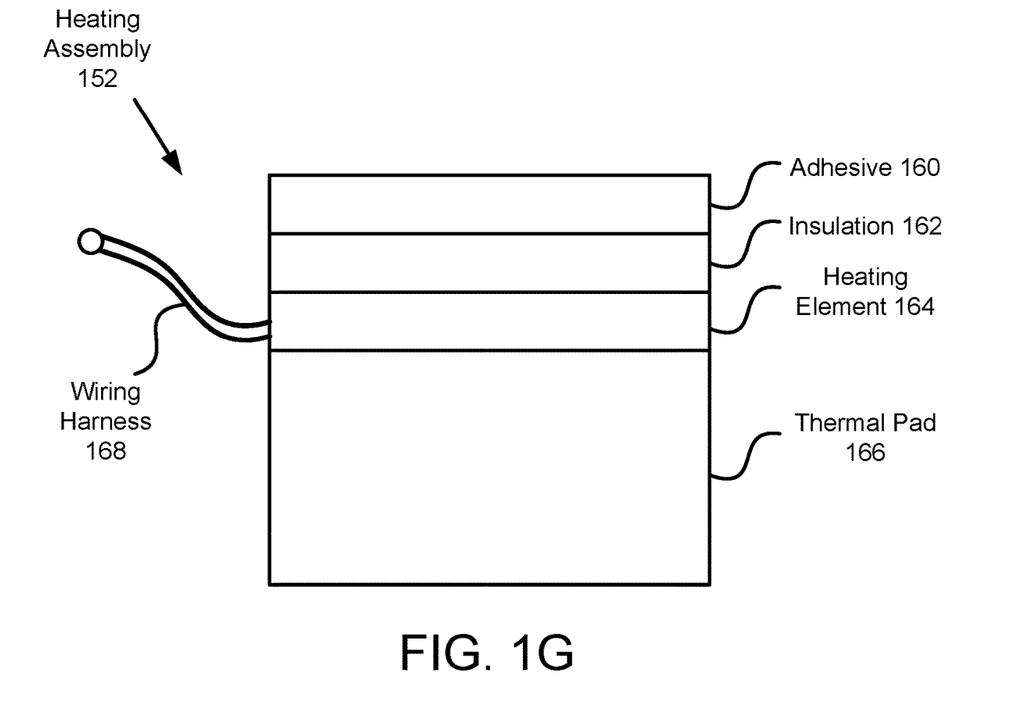
FIGS. 1G-1H show diagrams illustrating a heating assembly in accordance with an embodiment.

Refer to FIGS. 1B-1C for additional details regarding removable cards, and FIGS. 1E-1G for additional details regarding removable card holders in accordance with embodiments disclosed herein.

While illustrated in FIG. 1A with a limited number of specific components, a system may include additional, fewer, and/or different components without departing from embodiments disclosed herein.

Turning to FIG. 1B, a diagram illustrating removable card 104 in accordance with an embodiment is shown. As discussed above, removable card 104 may contribute computing resources (e.g., by performing operations) to a data processing system when positioned in a removable card holder.

To provide computing resources, removable card 104 may include circuit card 120 and any number of discrete components (e.g., 126, an example of a hardware component). Discrete component 126 may include, for example, packaged integrated circuits (e.g., "computer chips"), individual components such as resistor or capacitors, and/or other types of components. The physical and/or electrical characteristics of these components may limit a thermal operating range of discrete component 126. Different discrete components may have different thermal operating ranges depending on their constituent components, construction, and/or other factors.

In an embodiment, at least one discrete component has a thermal operating range that renders it unable to operate in environments with significant temperature variation. For example, the discrete component may have a thermal operating range that is conducive to operation in a data center environment where temperatures of gasses to used thermally manage a host data processing system are controlled within a certain range (e.g., greater than 0° degrees Celsius, via conditioning such as heating/cooling). However, other locations such as in ambient environments where temperatures of gasses used to cool host data processing systems are not controlled may, from time to time, may result in the ambient temperature being below the thermal operating range of the discrete component. If not addressed, the ambient temperature may cause the temperature of the discrete component to fall outside of the discrete component's thermal operating range.

Circuit card 120 may include traces 127 that interconnect (e.g., electrically) any of discrete components 126 and electrical contacts 122. While illustrated in FIG. 1B with an example topology, a removable card may include different types and/or arrangements of discrete components (e.g., 126) and electrical contacts 122, and/or different interconnection topologies facilitated by traces 127 without departing from embodiments disclosed herein.

In an embodiment, removable card 104 is implemented as a PCIe card.

Turning to FIG. 1C, a side view diagram of a portion of removable card 104 in accordance with an embodiment is shown. In FIG. 1C, the viewpoint may be from the left hand side of FIG. 1B, looking towards removable card 104 (electrical contacts 122 may be to the right hand side of FIG. 1C, but are not illustrated herein for conciseness, the dashed wavy line on the right hand side of FIG. 1C is used to indicate that removable card 104 may extend beyond the field of view shown in FIG. 1C).

To manage the temperature of discrete component 126 (which may generate heat during operation), heat sink 128 may be positioned with discrete component 126. Heat sink 128 may be a physical structure adapted to dissipate heat. For example, heat sink 128 may be placed in thermal communication with discrete component 126 via a thermal conduction path (e.g., physical contact, direct and/or via interface materials/layers). Thus, heat from discrete component 126 may flow to heat sink 128, so long as heat sink 128 is at a lower temperature than discrete component 126. The reverse may be true if heat sink 128 is at a higher temperature of discrete component 126. As will be discussed below, heat sink 128 may be warmed by a removable card holder to ensure that discrete component 126 is maintained within its thermal operating range.

To improve that likelihood that heat sink 128 is maintained at a lower temperature than discrete component 126 (e.g., while discrete component 126 generates heat), heat sink 128 may include fins, pins, and/or other physical components (not shown) to facilitate thermal exchange with gasses around heat sink 128. These physical components may be implemented with, for example, metals and/or other thermally conductive materials. The thermally conductive materials may be shaped (e.g., into fins, pins, etc.) to enhance the surface area of heat sink 128 thereby improving a rate of thermal exchange with the gasses. As will be discussed with respect to FIG. 1D, a host data processing system may generate a flow of gas to exhaust warmed gasses proximate to heat sink 128 and replace the exhausted gasses with cooled gasses. However, if the cooled gasses are below a thermal operating range of discrete component 126, then the heat dissipation by heat sink 128 may result in the temperature of discrete component 126 falling out of the thermal operating range.

While illustrated in FIG. 1C as being separate from discrete component 126, heat sink 128 may be a portion of discrete component 126 (e.g., such as a package in which an integrated circuit is positioned). For example, discrete component 126 may be implemented with a semiconductor device that is potted with a dielectric. The dielectric may be heat sink 128 rather than being a separate physical device, such as a metallic heat sink that may include a base for placement on a component and heat dissipation elements such as fins, pins, etc.

While illustrated in FIGS. 1B-C with a limited number of specific components, a removable card may include additional, fewer, and/or different components without departing from embodiments disclosed herein.

Turning to FIG. 1D, a top view diagram of data processing system 100 in accordance with an embodiment is shown. In FIG. 1D, only a limited number of components of data processing system 100 are illustrated for conciseness. As noted above, data processing system 100 may generate a flow of gas (e.g., illustrated in FIG. 1D with dashed wavy lines terminating in arrows) that may facilitate cooling of various devices positioned within chassis 110. However, when a temperature of the gas flow is outside the thermal operating ranges of various hardware components (e.g., such as discrete components of a removable card), the operation of the hardware components may be impaired if the gas flow reduces the temperatures of the hardware components to be outside of the corresponding thermal operating ranges.

To provide its functionality, data processing system 100 may include fan 130 (e.g., a portion of power/thermal Components 108). Fan 130 may selectively (e.g., at different points in time, under the direction of other components) generate the flow of gas. Fan 130 may be implemented with, for example, an electrical motor, fan blades, a housing, etc.

As seen in FIG. 1D, fan 130 may draw in gasses (e.g., the intake airflow) through an opening in chassis 110. The gasses may traverse through the interior of chassis 110. While traversing, at least a portion of the gasses may traverse proximate to removable card holder 102 and any removable cards positioned therein (e.g., which may displace warmed gasses near these components). The portion of the gasses may undergo thermal exchange thereby modifying the temperatures of removable card holder 102 and any removable cards positioned therein. Doing so may warm the portion of the gasses. The portion of the gasses then be directed out of the interior of chassis 110 (e.g., as an exhaust airflow).

To thermally manage removable cards in removable card holder 102, as noted above, removable card holder 102 may include functionality to warm portions of removable card positioned in removable card holder (e.g., while the removable cards contribute their functionality to use by a host data processing system). FIGS. 1E-1F illustrate diagrams in accordance with embodiments that show features of removable card holders that may provide for thermal management of removable cards positioned therein.

Turning to FIG. 1E, a first diagram of removable card holder 102 in accordance with an embodiment is shown. In FIG. 1E, an end view of removable card holder 102 is illustrated where the lengths of removable cards 104 positioned in removable card holder 102 may be aligned into and out of the page.

When so positioned, electrical contacts 122 of the removable cards may be positioned on the left side of the page to form an electrical connection with complementary electrical contacts 140 of removable card holder. As noted above, complementary electrical contacts 140 may be operably connected (e.g., via a wire harness, circuit card traces, etc., not shown) to other portions of a host data processing system such as a processor.

To provide its functionality, removable card holder 102 may include a body 142 and an access door 150. Each of these components is discussed below.

Body 142 may include a physical structure in which various removable cards may be positioned. Body 142 may include various portions that bound portion of a volume in which removable cards may be positioned. For example, body 142 may include sheets of material (e.g., sheet metal, plastic), Body 142 may include features to fixedly secure removable card 104 in an interior region of body 142. These features may allow for removable card 104 to be positioned, oriented, and retained within body 142. For example, body 142 may include arm 144. Arm 144 may be a physical structure that may slide or otherwise move between various positions (e.g., to allow insertion of and/or removal of removable cards). In FIG. 1E, arm 144 is shown in a position where it may fixedly hold the end of removable card 104 (e.g., to the right) in place. By doing so, electrical contacts 122 may be maintained in alignment and contact with complementary electrical contacts 140. To facilitate removal/insertion of removable cards, arm may, for example, translate and/or move (e.g., to the right in FIG. 1E) to release the edge of removable card 104 held in place. Then, removable card 104 may be disconnected (e.g., moved to the right in FIG. 1E) from complementary electrical contacts 140 and removed from the interior of body 142. The reverse process may be repeated to insert a removable card into body 142, and fixedly secure it in place.

As seen in FIG. 1E, a portion of body 142 may limit physical access to discrete component 126. For example, the portion of body 142 may be implemented with a sheet of metal that may be positioned above a surface of removable card 104 on which discrete component 126 is positioned.

To facilitate warming of discrete component 126, removable card holder 102 may include access door 150. Access door may be a physical structure positioned with body 142. Generally, access door 150 may move between positions (e.g., shown in FIG. 1E in a first position). In a first position, access door 150 may close body 142 (e.g., may be coplanar with a sheet or other portion of body 142 that is above removable card 104 or where removable card 104 may be positioned in removable card holder 102). While closed, a latch (e.g., 153) or other structure of body 142 may fixedly hold access door 150 in position.

In the second position, access door 150 may be rotated and/or translated with respect to body 142. Consequently, access door 150 may also be moved away from heat sink 128 of removable card 104.

Generally, access door 150 may be implemented with a sheet of material. Access door may be connected to body 142 via one or more joints (e.g., rotational joints facilitating rotation, sliding joints facilitate translation, etc.). For example, joint 154 may be implemented with a rotational joint that facilitates rotation of access door 150 about joint 154 (e.g., in FIG. 1E, counterclockwise away from body 142, and clockwise toward body 142). Joint 154 may be connected to body 142.

To warm discrete component 126, heating assembly 152 may be positioned on access door 150. Heating assembly 152 may be positioned on an interior surface of access door 150 (e.g., facing removable card 104). Heating assembly 152 may have a shape and size, and may be formed from a material that allows heating assembly 152 to make contact with heat sink 128 while access door 150 is in the first position (e.g., closed position). For example, heating assembly 152 may include a portion of compliant material that may conform itself to a shape of a portion of heat sink 128 (e.g., as access door 150 is moved from the second position to the first position), and maintain the conformed shape (e.g., while access door 150 is in the first position). The contact between heating assembly 152 and heat sink 128 may form a thermal conduction path that places heating assembly 152 in thermal communication with discrete component 126 while access door 150 is in the first position thereby facilitating efficient warming through conduction based thermal transfer.

To facilitate insertion and removal of removable cards, access door 150 may be moved to the second position. When doing so, the movement path of access door 150, and heating assembly 152, may generally be directed away from heat sink 128 (in contrast to along a surface of heat sink 128), at least until the compliant material of heating assembly 152 is no longer in contact with heat sink 128. The surface of heat sink 128 may include various features (e.g., fins, pins, etc.) having sharp points or edges that may damage the compliant material if the compliant material, while conformed to the shape of the portion of heat sink 128, is moved along the surface of heat sink 128. Consequently, by moving away from heat sink 128 until physical contact is released, the life of the compliant material may be extended by preventing or reducing contact based damage.

Refer to FIG. 1G for additional details regarding heating assembly 152.

Turning to FIG. 1F, a second diagram of removable card holder 102 in accordance with an embodiment is shown. In FIG. 1F, a similar view to that shown in FIG. 1E is shown. In contrast to FIG. 1E, in FIG. 1F access door 150 is in an example second position. As seen in FIG. 1F, when moving between the first and second position, access door 150, and heating assembly 152 thereof, may have rotated away from heat sink 128. This motions path may initial move heating assembly 152 away from heat sink 128 thereby reducing the potential for damage to heating assembly 152.

It will be understood that access door 150 may be physically connected to body 142 via other types of joints that may facilitate different motion paths that facilitate movement of heating assembly 152 towards and away from where a heatsink of a removable card positioned in removable card holder 102 may be positioned.

Additionally, while illustrated in FIGS. 1E-1F with a single access door, it will be appreciated that a removable card holder may include any number of access doors, each of which may have similar or different sizes to facilitate warming of any number of hardware components. Additionally, while shown in these figures as establishing a condition path with a single heat sink, a heating assembly and access door may have shapes, sizes, positions, and/or orientations to facilitate formation of conduction paths with multiple heat sinks of a removable card thereby facilitating warming of multiple hardware components of a removable card using a single heating assembly.

While illustrated in FIGS. 1E-1F with a limited number of specific components, a removable card holder 102 may include additional, fewer, and/or different components without departing from embodiments disclosed herein.

Turning to FIG. 1G, a diagram of heating assembly 152 in accordance with an embodiment is shown. Heating assembly 152 may include adhesive 160, insulation 162, heating element 164, thermal pad 166, and wiring harness 168.

Adhesive 160 may facilitate attachment of heating assembly 152 to an access door. Adhesive 160 may be implemented with any material to facilitate attachment of the other components of heating assembly to the access door.

Insulation 162 may thermally insulate an attachment door, to which heating assembly 152 is attached, from heating element 164. Insulation 162 may be implemented with a layer of thermal insulation.

Heating element 164 may generate heat. For example, heating element 164 may be implemented with a thin film heating device which may include a heating element. The heating element may be connected to wiring harness 168 through which electrical power may be obtained and used by heating element 164 to generate heat. The heating element may be implemented with, for example, a resistive heater (e.g., thin film, etc.).

Thermal pad 166 may facilitate formation of thermal conduction paths between heating element 164 and other devices. Thermal pay may be implemented with a compliant material that may conform itself to the shape of a component to which thermal pad 166 is pressed.

Figure 1H:
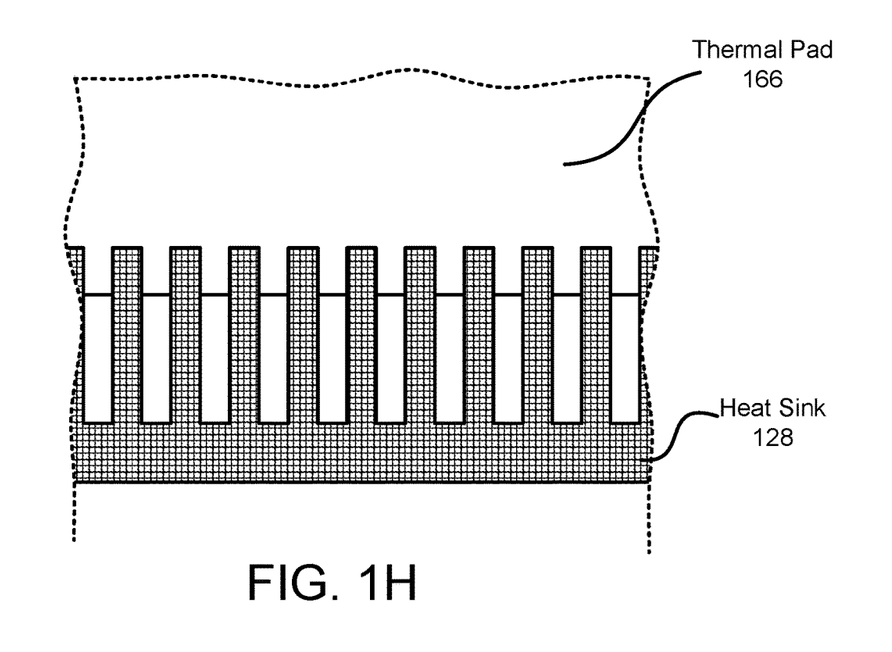

For example, turning to FIG. 1H, a diagram of thermal pad 166 placed in contact with heat sink 128 in accordance with an embodiment is shown. As seen in FIG. 128, a surface of heat sink 128 to which thermal pad 166 is in contact with may be rough (e.g., include fins, pins, etc.). Thermal pad 166 may flow or otherwise change its shape (e.g., when pressed against the surface) to be complementary to that presented by heat sink 128. Consequently, a thermal condition path may be formed with both top and some side surface of portions of heat sink 128 (e.g., some of the surface between the fins).

Figure 2:
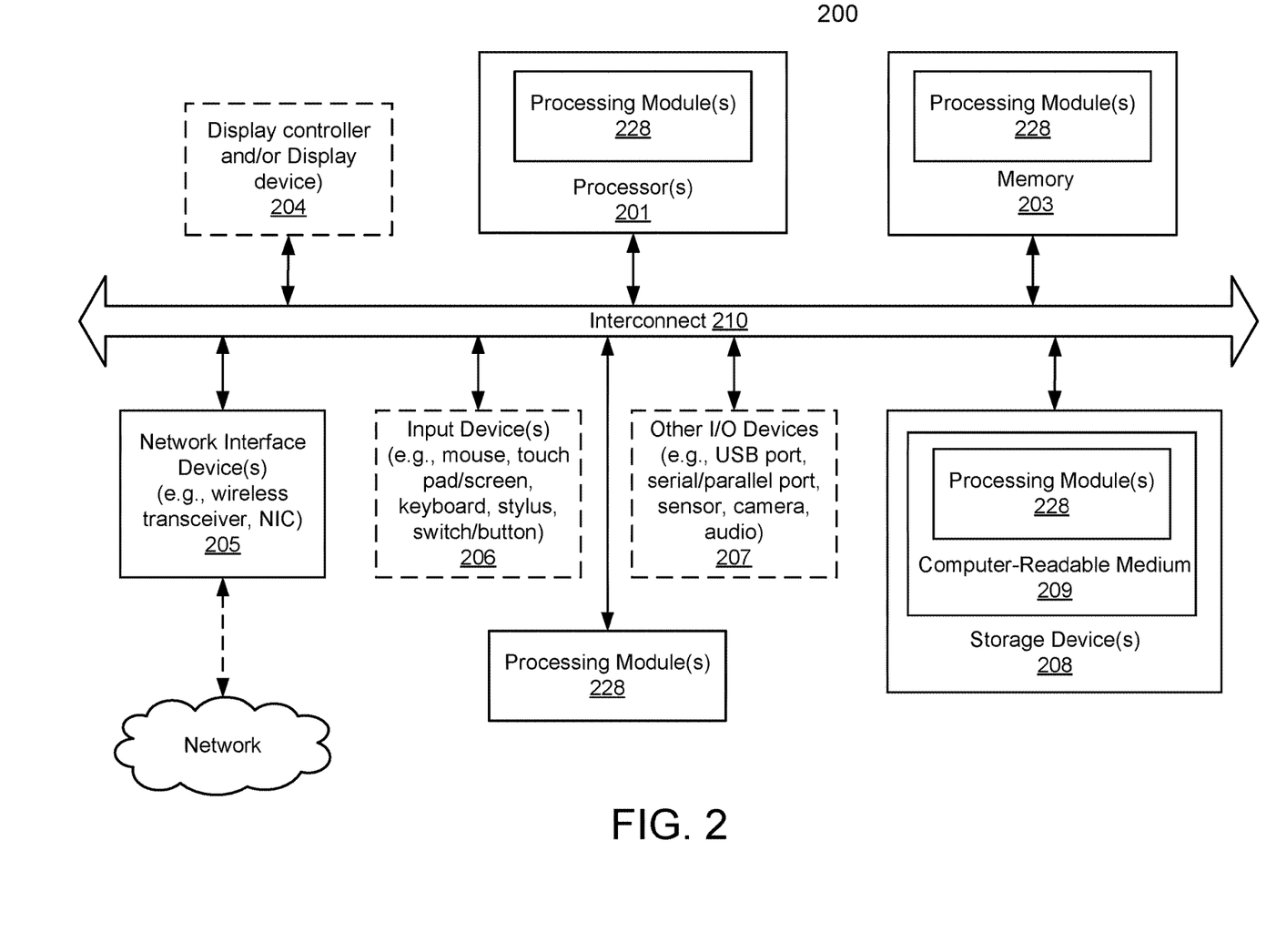
FIG. 2 shows a block diagram illustrating a computing device in accordance with an embodiment.

As discussed with respect to FIG. 1A, data processing system 100 may be implemented with a computing device. Turning to FIG. 2, a block diagram illustrating an example of a computing device in accordance with an embodiment is shown. For example, system 200 may represent any of the data processing systems and/or computing devices described above performing any of the processes or methods described above. System 200 can include many different components.

These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 200 is intended to show a high-level view of many components of the computer system. However, it is to be understood that additional components may be present in certain implementations and furthermore, different arrangement of the components shown may occur in other implementations. System 200 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 200 includes processor 201, memory 203, and devices 205-208 via a bus or an interconnect 210. Processor 201 may represent a single processor or multiple processors with a single processor core or multiple processor cores included therein.

Processor 201 may represent one or more general-purpose processors such as a microprocessor, a central processing unit (CPU), or the like. More particularly, processor 201 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 201 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 201, which may be a low power multi-core processor socket such as an ultra-low voltage processor, may act as a main processing unit and central hub for communication with the various components of the system. Such processor can be implemented as a system on chip (SoC). Processor 201 is configured to execute instructions for performing the operations discussed herein. System 200 may further include a graphics interface that communicates with optional graphics subsystem 204, which may include a display controller, a graphics processor, and/or a display device.

Processor 201 may communicate with memory 203, which in one embodiment can be implemented via multiple memory devices to provide for a given amount of system memory. Memory 203 may include one or more volatile storage (or memory) devices such as random access memory (RAM), dynamic RAM (DRAM), synchronous DRAM (SDRAM), static RAM (SRAM), or other types of storage devices. Memory 203 may store information including sequences of instructions that are executed by processor 201, or any other device. For example, executable code and/or data of a variety of operating systems, device drivers, firmware (e.g., input output basic system or BIOS), and/or applications can be loaded in memory 203 and executed by processor 201. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 200 may further include IO devices such as devices (e.g., 205, 206, 207, 208) including network interface device(s) 205, optional input device(s) 206, and other optional IO device(s) 207. Network interface device(s) 205 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 206 may include a mouse, a touch pad, a touch sensitive screen (which may be integrated with a display device of optional graphics subsystem 204), a pointer device such as a stylus, and/or a keyboard (e.g., physical keyboard or a virtual keyboard displayed as part of a touch sensitive screen). For example, input device(s) 206 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 207 may include an audio device. An audio device may include a speaker and/or a microphone to facilitate voice-enabled functions, such as voice recognition, voice replication, digital recording, and/or telephony functions. Other IO devices 207 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 207 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 210 via a sensor hub (not shown), while other devices such as a keyboard or thermal sensor may be controlled by an embedded controller (not shown), dependent upon the specific configuration or design of system 200.

To provide for persistent storage of information such as data, applications, one or more operating systems and so forth, a mass storage (not shown) may also couple to processor 201. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 201, e.g., via a serial peripheral interface (SPI). This flash device may provide for non-volatile storage of system software, including a basic input/output software (BIOS) as well as other firmware of the system.

Storage device 208 may include computer-readable storage medium 209 (also known as a machine-readable storage medium or a computer-readable medium) on which is stored one or more sets of instructions or software (e.g., processing module, unit, and/or processing module/unit/logic 228) embodying any one or more of the methodologies or functions described herein. Processing module/unit/logic 228 may represent any of the components described above. Processing module/unit/logic 228 may also reside, completely or at least partially, within memory 203 and/or within processor 201 during execution thereof by system 200, memory 203 and processor 201 also constituting machine-accessible storage media. Processing module/unit/logic 228 may further be transmitted or received over a network via network interface device(s) 205.

Computer-readable storage medium 209 may also be used to store some software functionalities described above persistently. While computer-readable storage medium 209 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 228, components and other features described herein can be implemented as discrete hardware components or integrated in the functionality of hardware components such as ASICS, FPGAs, DSPs or similar devices. In addition, processing module/unit/logic 228 can be implemented as firmware or functional circuitry within hardware devices. Further, processing module/unit/logic 228 can be implemented in any combination hardware devices and software components.

Note that while system 200 is illustrated with various components, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data processing system, comprising:
a processor; and
a removable card holder comprising:
    a housing delineating a volume in which a removable card is positioned while the removable card is in the removable card holder;
    complementary electrical contacts operably connected to the processor, the complementary electrical contacts being adapted to contact electrical contacts of the removable card while the removable card is positioned in the removable card holder to form an operable connection between the processor and the removable card;
    an access door positioned on a surface of the housing that prevents access to a portion of the removable card while the removable card is in the removable card holder, the access door adapted to:
        translate between two positions, in a first position of the two positions the access door closes the surface of the housing and in a second position of the two positions the access door opens a hole in the surface that allows access to the portion of the removable card while the removable card is in the removable card holder; and a heating assembly positioned on the access door to contact the portion of the removable card while the access door is in the first position and the removable card is in the removable card holder and disengage the contact without translating along a surface of the portion of the removable card while the access door moves from the first position to the second position.

2. The data processing system of claim 1, wherein the heating assembly comprises:
a heating element adapted to selectively generate heat to warm the removable card while the access door is in the first position and the removable card is in the removable card holder.

3. The data processing system of claim 2, wherein the heating assembly further comprises:
a thermal pad adapted to conform to a shape of the portion of the removable card while the access door moves from the second position to the first position and the removable card is in the removable card holder.

4. The data processing system of claim 3, wherein the thermal pad is further adapted to conduct heat between the heating element and the portion of the removable card while the access door is in the second position.

5. The data processing system of claim 4, wherein the access door comprises:
a rotary joint adapted to guide the access door between the two positions along a curved path.

6. The data processing system of claim 4, wherein the access door comprises:
a sliding joint adapted to guide the access door between the two positions along a straight path.

7. The data processing system of claim 1, wherein the housing comprises:
a latch positioned with an edge of the access door, and the latch being adapted to reversibly hold the access door in the first position.

8. The data processing system of claim 1, wherein the removable card holder comprises a Peripheral Component Interconnect Express (PCIe) riser cage.

9. A removable card holder for a data processing system, the removable card holder comprising:
a housing delineating a volume in which a removable card is positioned while the removable card is in the removable card holder;
complementary electrical contacts operably connected to a processor of a host data processing system, the complementary electrical contacts being adapted to contact electrical contacts of the removable card while the removable card is positioned in the removable card holder to form an operable connection between the processor and the removable card;
an access door positioned on a surface of the housing that prevents access to a portion of the removable card while the removable card is in the removable card holder, the access door adapted to:
translate between two positions, in a first position of the two positions the access door closes the surface of the housing and in a second position of the two positions the access door opens a hole in the surface that allows access to the portion of the removable card while the removable card is in the removable card holder; and
a heating assembly positioned on the access door to contact the portion of the removable card while the access door is in the first position and the removable card is in the removable card holder and disengage the contact without translating along a surface of the portion of the removable card while the access door moves from the first position to the second position.

10. The removable card holder of claim 9, wherein the heating assembly comprises:
a heating element adapted to selectively generate heat to warm the removable card while the access door is in the first position and the removable card is in the removable card holder.

11. The removable card holder of claim 10, wherein the heating assembly further comprises:
a thermal pad adapted to conform to a shape of the portion of the removable card while the access door moves from the second position to the first position and the removable card is in the removable card holder.

12. The removable card holder of claim 11, wherein the thermal pad is further adapted to conduct heat between the heating element and the portion of the removable card while the access door is in the second position.

13. The removable card holder of claim 12, wherein the access door comprises:
a rotary joint adapted to guide the access door between the two positions along a curved path.

14. The removable card holder of claim 12, wherein the access door comprises:
a sliding joint adapted to guide the access door between the two positions along a straight path.

15. The removable card holder of claim 9, wherein the housing comprises:
a latch positioned with an edge of the access door, and the latch being adapted to reversibly hold the access door in the first position.

16. The removable card holder of claim 9, wherein the removable card holder comprises a Peripheral Component Interconnect Express (PCIe) riser cage.

17. A data processing system, comprising:
a processor; and
a removable card comprising a temperature sensitive hardware component;
a removable card holder comprising:
a housing delineating a volume in which a removable card is positioned;
complementary electrical contacts operably connected to the processor, the complementary electrical contacts being adapted to contact electrical contacts of the removable card while the removable card is positioned in the removable card holder to form an operable connection between the processor and the temperature sensitive hardware component of the removable card;
an access door positioned on a surface of the housing that prevents access to the temperature sensitive hardware component while the removable card is in the removable card holder, the access door being adapted to:
translate between two positions, in a first position of the two positions the access door closes the surface of the housing and in a second position of the two positions the access door opens a hole in the surface that allows access to the temperature sensitive hardware component; and
a heating assembly positioned on the access door to contact the removable card while the access door is in the first position and disengage the contact without translating along a surface of the removable card while the access door moves from the first position to the second position.

18. The data processing system of claim 17, wherein the heating assembly comprises:
   a heating element adapted to selectively generate heat to warm the temperature hardware sensitive component of the removable card while the access door is in the first position and the removable card is in the removable card holder.

19. The data processing system of claim 18, wherein the heating assembly further comprises:
   a thermal pad adapted to conform to a shape of a portion of the removable card while the access door moves from the second position to the first position and the removable card is in the removable card holder.

20. The data processing system of claim 19, wherein the thermal pad is further adapted to conduct heat between the heating element and the temperature sensitive hardware component of the removable card while the access door is in the second position.

* * * * *